United States Patent
Senn et al.

(10) Patent No.: US 12,015,115 B2
(45) Date of Patent: Jun. 18, 2024

(54) OPTOELECTRONIC MODULES HAVING FLUID PERMEABLE CHANNELS AND METHODS FOR MANUFACTURING THE SAME

(71) Applicant: ams Sensors Singapore Pte. Ltd., Singapore (SG)

(72) Inventors: Tobias Senn, Zurich (CH); Julien Boucart, Zurich (CH); Susanne Westenhöfer, Wettswil (CH)

(73) Assignee: AMS SENSORS SINGAPORE PTE. LTD., Singapore (SG)

(*) Notice: Subject to any disclaimer, the term of this patent is extended or adjusted under 35 U.S.C. 154(b) by 0 days.

(21) Appl. No.: 17/148,087

(22) Filed: Jan. 13, 2021

(65) Prior Publication Data

US 2021/0135077 A1    May 6, 2021

Related U.S. Application Data

(62) Division of application No. 16/071,320, filed as application No. PCT/SG2017/050027 on Jan. 19, 2017, now abandoned.

(Continued)

(51) Int. Cl.
*H01L 33/64* (2010.01)
*H01L 27/146* (2006.01)
(Continued)

(52) U.S. Cl.
CPC ...... *H01L 33/648* (2013.01); *H01L 27/14618* (2013.01); *H01L 27/14685* (2013.01);
(Continued)

(58) Field of Classification Search
CPC ............ H01L 33/648; H01L 27/14618; H01L 27/14685; H01L 33/0095; H01L 33/486;
(Continued)

(56) References Cited

U.S. PATENT DOCUMENTS 7,883,244 B2   2/2011  Hsu et al.
9,281,301 B2*  3/2016  Haslbeck .............. H01L 31/167
(Continued)

FOREIGN PATENT DOCUMENTS

CN    2741196 Y    11/2005
JP    S56138370 A  10/1981
(Continued)

OTHER PUBLICATIONS

Office Action issued from the Chinese Patent Office for related Application No. 201780017117.2 dated Apr. 30, 2021 (8 Pages including the Statement of Relevance).
(Continued)

*Primary Examiner* — Duy T Nguyen
(74) *Attorney, Agent, or Firm* — VIERING, JENTSCHURA & PARTNER mbB

(57) ABSTRACT

An optoelectronic module includes a spacer with an optical component mounting surface, a fluid permeable channel, and a module mounting surface. The fluid permeable channel and module mounting surface allow the channels to be sealed to foreign matter during certain manufacturing steps and to remain free from blockages, such as solidified flux, during certain manufacturing steps. Further, the channels can permit heat to escape from the optoelectronic module during operation.

9 Claims, 10 Drawing Sheets

Related U.S. Application Data

(60) Provisional application No. 62/280,848, filed on Jan. 20, 2016.

(51) Int. Cl.
| | |
|---|---|
| *H01L 33/00* | (2010.01) |
| *H01L 33/48* | (2010.01) |
| *H01L 33/56* | (2010.01) |
| *H01S 5/0232* | (2021.01) |
| *H01S 5/0236* | (2021.01) |
| *H01S 5/024* | (2006.01) |

(52) U.S. Cl.
CPC ........ *H01L 33/0095* (2013.01); *H01L 33/486* (2013.01); *H01L 33/56* (2013.01); *H01S 5/0232* (2021.01); *H01S 5/0236* (2021.01); *H01S 5/02423* (2013.01); *H01L 2933/0058* (2013.01)

(58) Field of Classification Search
CPC ............. H01L 33/56; H01L 2933/0058; H01S 5/0231; H01S 5/0236; H01S 5/02423
USPC .......................................................... 438/28
See application file for complete search history.

(56) References Cited

U.S. PATENT DOCUMENTS

| | | | |
|---|---|---|---|
| 9,559,268 B2 | 1/2017 | Ahn et al. | |
| 9,954,143 B2 | 4/2018 | Tanuma | |
| 9,966,493 B2 | 5/2018 | Rudmann et al. | |
| 2003/0102481 A1* | 6/2003 | Isoda .................... | H01L 33/486 257/79 |
| 2005/0072981 A1* | 4/2005 | Suenaga ............... | H01L 33/486 257/E33.059 |
| 2008/0116562 A1 | 5/2008 | Lien et al. | |
| 2011/0051423 A1 | 3/2011 | Hand et al. | |
| 2011/0241028 A1* | 10/2011 | Park ..................... | H01L 33/483 257/E33.056 |
| 2012/0126269 A1 | 5/2012 | Tanuma | |
| 2012/0193671 A1 | 8/2012 | Chien | |
| 2014/0084322 A1* | 3/2014 | Park ..................... | H01L 33/483 257/98 |
| 2014/0226308 A1 | 8/2014 | Fukuda et al. | |
| 2014/0264831 A1 | 9/2014 | Meyer | |
| 2014/0268822 A1 | 9/2014 | Olsson et al. | |
| 2014/0294629 A1* | 10/2014 | Kim ..................... | F04B 43/046 417/480 |
| 2014/0312368 A1 | 10/2014 | Lee et al. | |
| 2014/0367718 A1* | 12/2014 | Park ..................... | H01L 33/48 438/26 |
| 2015/0098209 A1 | 4/2015 | Ahn et al. | |
| 2016/0071767 A1* | 3/2016 | Hashimoto ....... | H01L 21/02019 257/620 |
| 2016/0112808 A1 | 4/2016 | Geiger et al. | |
| 2016/0155907 A1* | 6/2016 | Ozeki .................... | H01L 33/62 257/98 |
| 2017/0038459 A1 | 2/2017 | Kubacki et al. | |

FOREIGN PATENT DOCUMENTS

| | | |
|---|---|---|
| TW | M468011 U | 12/2013 |
| WO | 2013091829 A1 | 6/2013 |
| WO | 2013133594 A1 | 9/2013 |
| WO | 2015136100 A2 | 9/2015 |

OTHER PUBLICATIONS

Office Action issued from the European Patent Office for related Application No. 17741742.5 dated Jul. 22, 2020 (7 Pages).
Office Action issued from the Taiwan Patent Office for related Application No. 106101860 dated Apr. 20, 2020 (13 Pages including English translation).
Extended Search Report issued from the European Patent Office for related Application No. 17741742.5, dated Oct. 15, 2018 (7 Pages).
International Search Report with Written Opinion for related Application No. PCT/SG2017/050027 dated Apr. 5, 2017 (8 Pages).
Advisory Action for corresponding U.S. Appl. No. 16/071,320, dated Nov. 30, 2020, 3 pages (for informational purposes only).

* cited by examiner

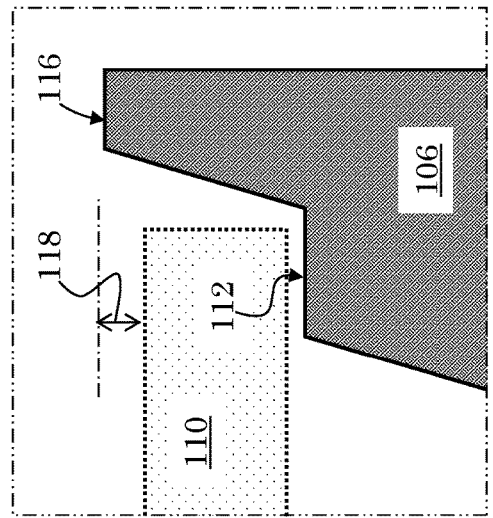
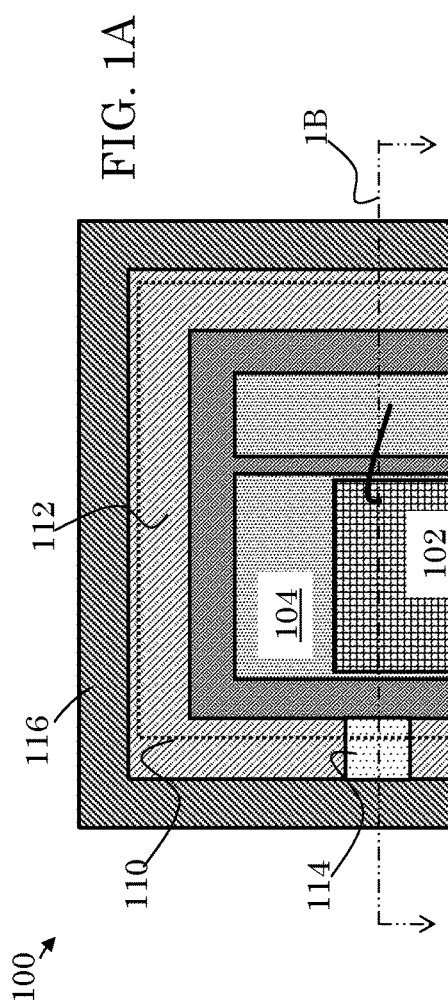
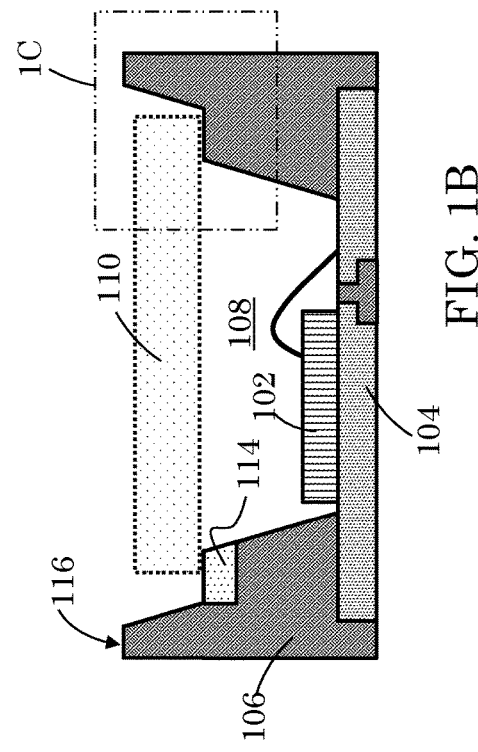

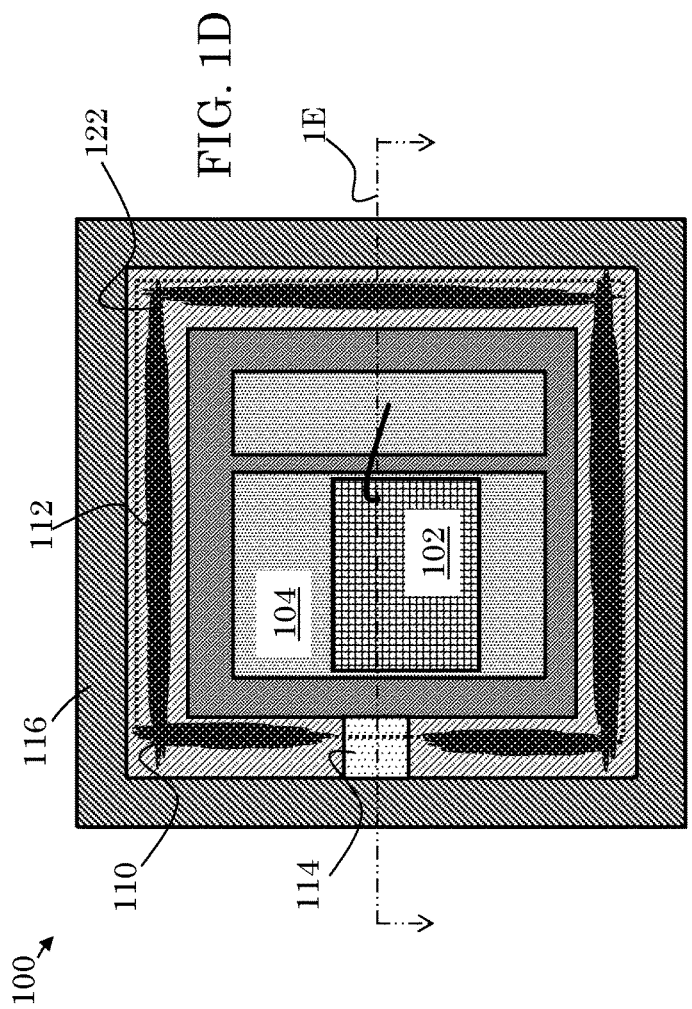
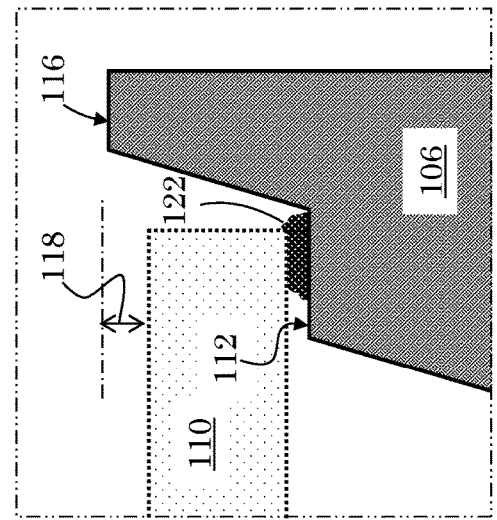
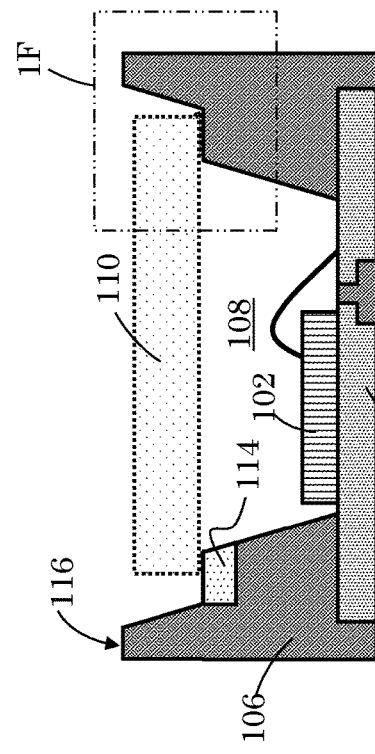

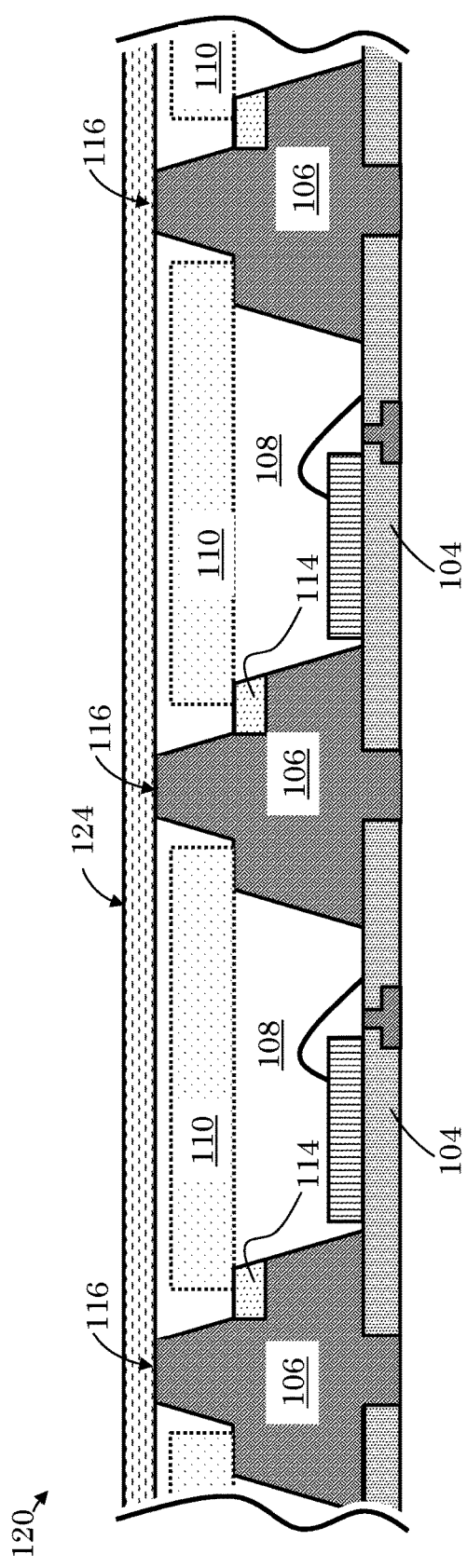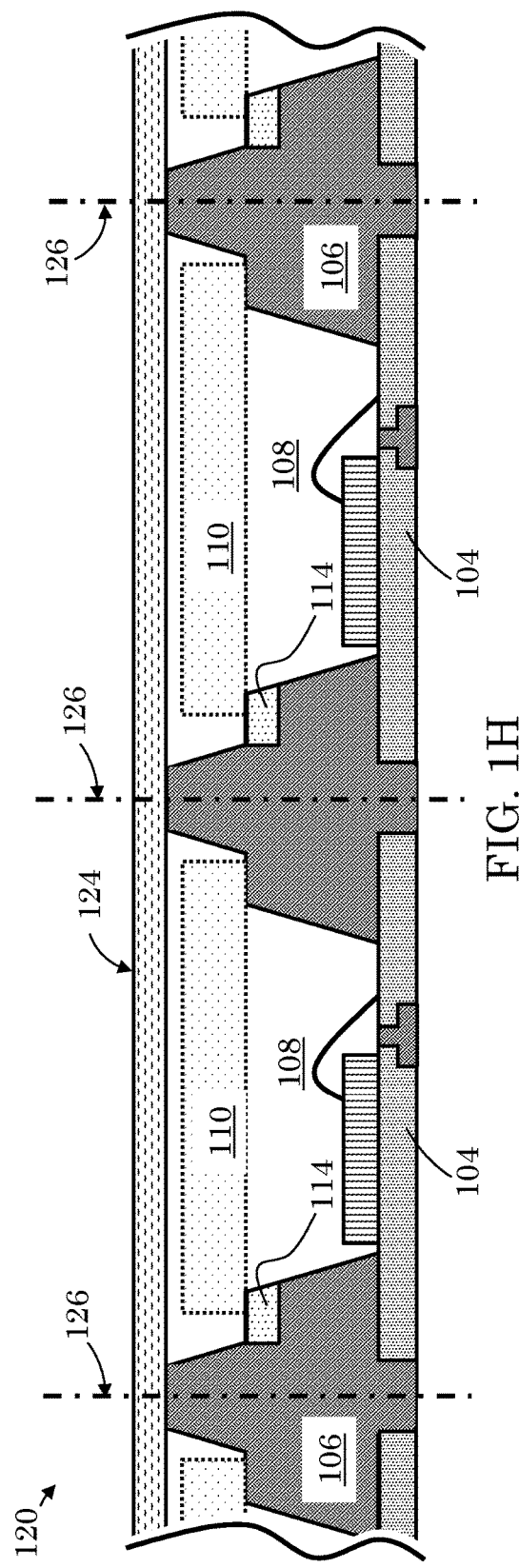
FIG. 1G
FIG. 1H

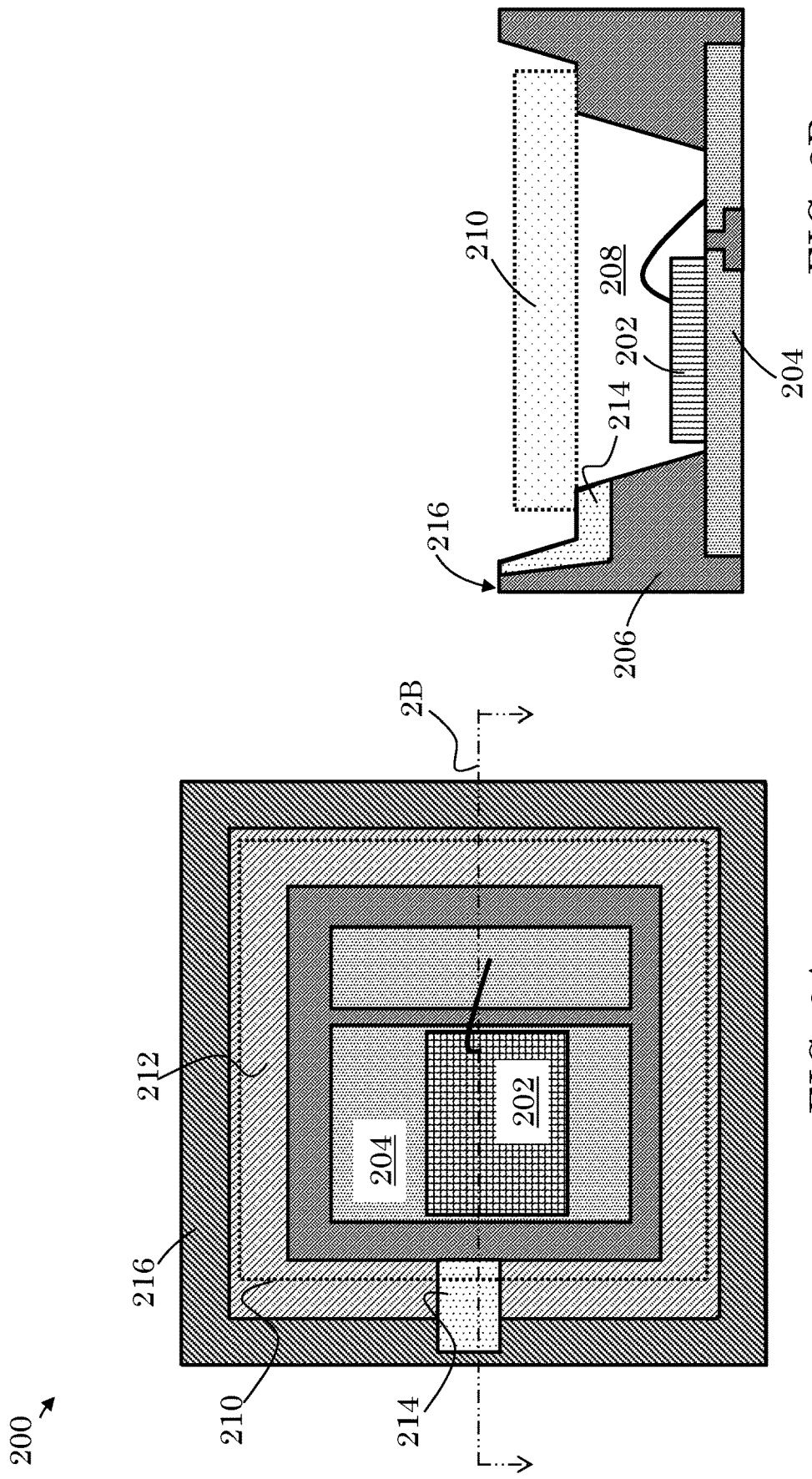

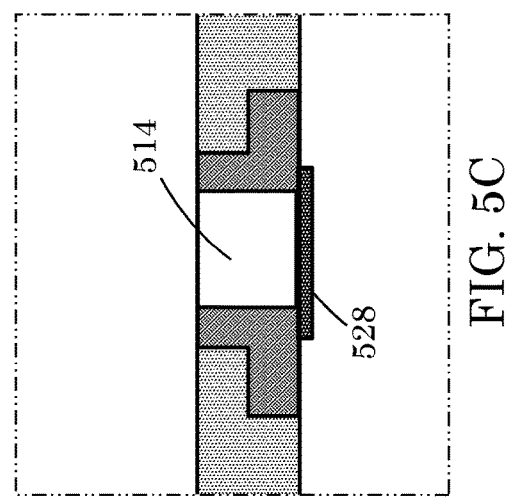
FIG. 5C
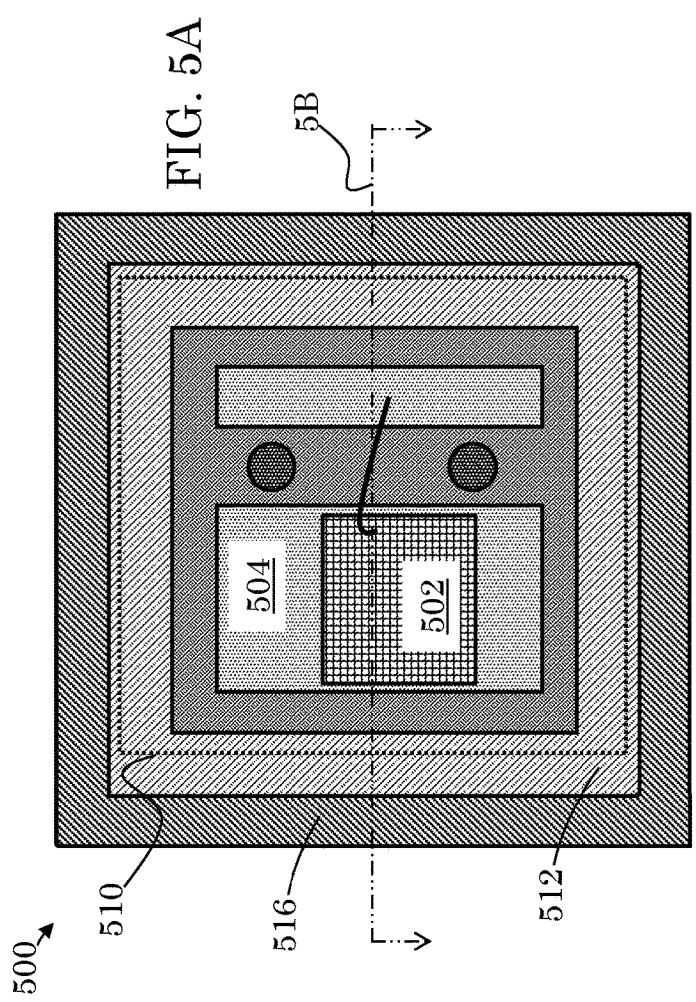
FIG. 5A
FIG. 5B

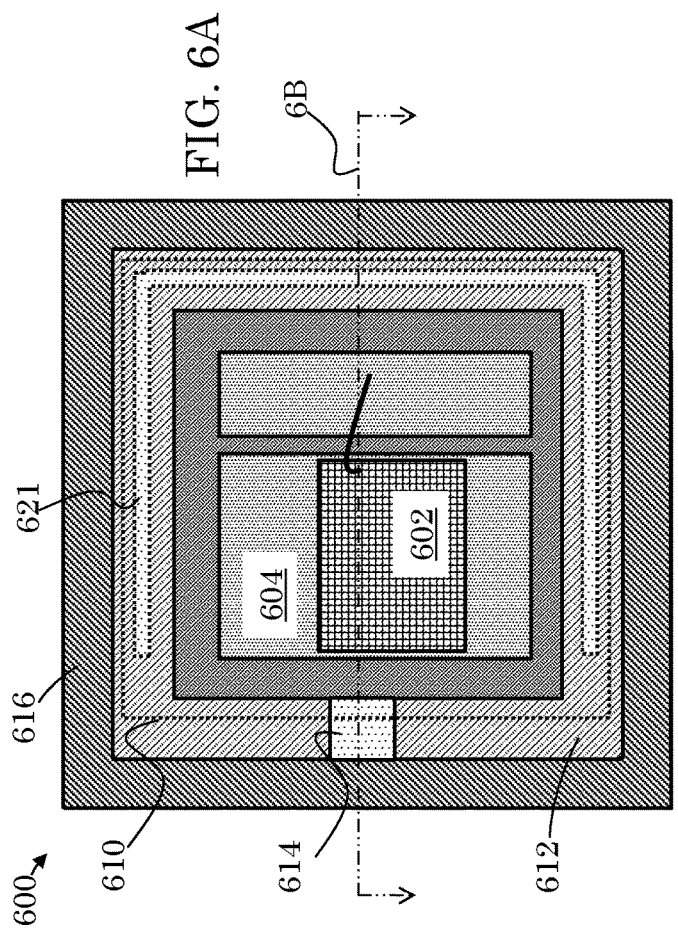
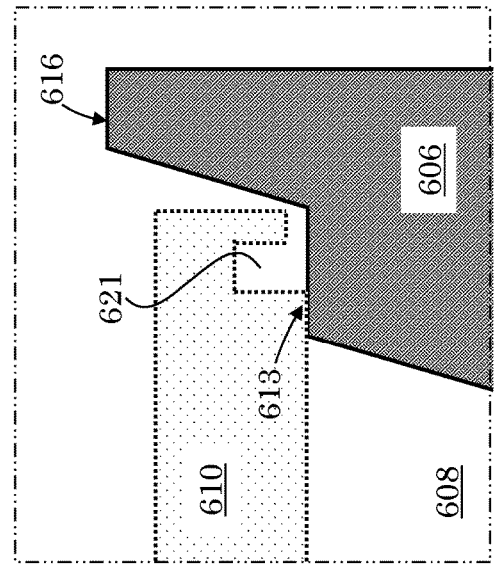
FIG. 6C
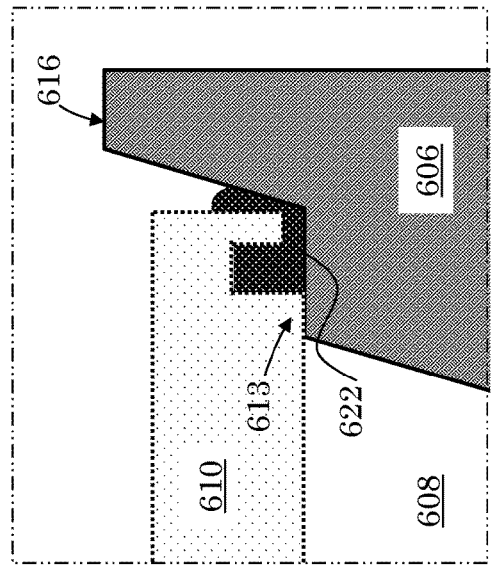
FIG. 6D
FIG. 6B

OPTOELECTRONIC MODULES HAVING FLUID PERMEABLE CHANNELS AND METHODS FOR MANUFACTURING THE SAME

CROSS-REFERENCE TO RELATED APPLICATION(S)

The present application is a Divisional Application of the U.S. patent application Ser. No. 16/071,320, filed Jul. 19, 2018, which is the U.S. national stage entry, under 35 U.S.C. § 371 of International Application No. PCT/SG2017/050027, filed Jan. 19, 2017, which claims the benefit of priority of the U.S. Provisional Patent Application No. 62/280,848, filed on Jan. 20, 2016. The contents of the earlier application are incorporated here by reference in their entirety.

BACKGROUND

A typical optoelectronic module is often constructed with at least one fluid permeable channel, such as a venting hole, designed to allow fluids, such as gasses, to pass into or out of a cavity within the module. Fluid permeable channels can be incorporated into a module for a number of reasons. For example, a module that includes a heat-generating active optoelectronic component (e.g., a laser diode or a light-emitting diode) mounted onto an electrical substrate within a cavity may require a fluid-permeable channel for optimum performance. That is, during operation, heat generated by the component can accumulate within the module and can alter the performance of temperature-sensitive electronic components or alter the size or shape of dimension-critical components, such as optical elements (e.g., refractive, diffractive lenses) or spacers between optical elements. A fluid-permeable channel through the electronic substrate and adjacent to the heat-generating component, however, can conduct heat out of the cavity and away from any adjacent temperature-sensitive electronic components, optical elements, or spacers.

The process for manufacturing an optoelectronic module influences the location of the fluid-permeable channel within the module. Often, wafer-level manufacturing methods are employed to manufacture a wafer of tens, hundreds, or even thousands of contiguous optoelectronic modules. Subsequent manufacturing steps require separating (e.g., dicing) the wafer of contiguous optoelectronic modules into discrete modules. The separating process, however, can introduce foreign matter (e.g., dicing fluid, dicing particles) into the module via the fluid-permeable channels. The foreign matter can detrimentally affect performance and, in some instances, can generate serious eye-safety concerns.

Consequently, the wafer of contiguous optoelectronic modules is typically mounted onto a separation substrate such as dicing tape via the electronic substrate wherein the fluid-permeable channels have been previously incorporated. The procedure effectively seals off the fluid-permeable channels for the subsequent separating steps thereby preventing foreign matter from entering into the optoelectronic modules via the fluid permeable channels.

Nevertheless, while incorporating the fluid-permeable channels into the electronic substrate effectively keeps foreign matter out of the modules during the separating step, the location provides serious complications for subsequent manufacturing steps. For example, electronic components located adjacent to the fluid-permeable channels are mounted electrically to the electronic substrate with solder and flux. During this process, the electronic substrate (i.e., the substrate into which the fluid-permeable channels have been incorporated), solder, and flux are heated (to melt the solder and flux), and then cooled. Upon cooling a vacuum can be generated within the optoelectronic module. Any flux still in a fluidic state can be drawn into an adjacent fluid-permeable channel, wherein upon further cooling the solder flux can solidify and can block the channel. Consequently, any heat generated by components within the module during operation could accumulate, and could seriously affect performance.

SUMMARY

This disclosure describes discrete optoelectronic modules and wafers having pluralities of contiguous optoelectronic modules. The optoelectronic modules include fluid permeable channels, and are configured such that: 1) the channels are sealed to foreign matter during certain manufacturing steps, such as steps involving the separation of a plurality of contiguous modules into a plurality of discrete, non-contiguous modules; 2) the channels remain free from blockages, such as solidified flux, during certain manufacturing steps, such as steps involving electrically mounting components; 3) the channels can permit heat (i.e., heated fluids) to escape from the optoelectronic module during operation; 4) incorporated spacers can mitigate or eliminate cross-talk; 5) incorporated alignment components can permit the precise alignment of optical components and respective active optoelectronic components; and/or 6) incorporated adhesive channels can prevent adhesive from migrating onto optical components.

In a first aspect, for example, an optoelectronic module includes an active optoelectronic component mounted electrically to an active optoelectronic component substrate, and a spacer laterally surrounding the active optoelectronic component thereby forming a chamber. The spacer includes an optical component mounting surface, a fluid permeable channel, and a module mounting surface. The optoelectronic module further includes an optical component mounted onto the optical component mounting surface.

In another aspect, for example, an optoelectronic module includes a fluid permeable channel. The channel can be adjacent to an optical component mounting surface.

In another aspect, for example, an optoelectronic module includes a module mounting surface adjacent to an optical component mounting surface.

In another aspect, for example, an optoelectronic module includes an active optoelectronic component operable to emit a particular range of wavelengths of electromagnetic radiation, and in some instance, can include an active optoelectronic component sensitive to a particular range of wavelengths of electromagnetic radiation.

In another aspect, for example, an optoelectronic module includes a spacer that is substantially non-transmissive to a particular range of wavelengths of electromagnetic radiation.

In another aspect, for example, an optoelectronic module includes an optical component mounted to an optical component mounting surface with adhesive.

In another aspect, for example, an optoelectronic module includes a spacer having an adhesive channel adjacent to an optical component mounting surface.

In another aspect, for example, an optoelectronic module includes a spacer with an alignment component and an adhesive channel. Both the alignment component and the adhesive channel can be adjacent to an optical component mounting surface.

In another aspect, for example, an optoelectronic module includes an optical component having an adhesive channel and an alignment component.

In another aspect, for example, an optoelectronic module includes a fluid permeable channel adjacent to an active optoelectronic component. The fluid permeable channel can include a fluid permeable membrane.

In another aspect, for example, an optoelectronic module includes a module mounting surface. The module mounting surface can be operable to seal a chamber and a fluid-permeable channel when the module mounting surface is in contact with an adhesive substrate.

In another aspect, for example, an optoelectronic module includes an active optoelectronic component. The active optoelectronic component can be a laser diode, a light-emitting diode, an array of laser diodes, and/or an array of light emitting diodes.

In another aspect, for example, an optoelectronic module includes an active optoelectronic component. The active optoelectronic component can be a photodiode, an array of photodiodes, and/or an array of pixels.

In another aspect, for example, an optoelectronic module includes a spacer. The spacer can be composed, at least in part, of a polymeric material.

In another aspect, for example, an optoelectronic module includes an active optoelectronic component substrate. The active optoelectronic component substrate can be composed, at least in part, of a lead frame.

In another aspect, for example, a method of manufacturing an optoelectronic module from a plurality of optoelectronic modules includes the step of mounting electrically a plurality of active optoelectronic components to an active optoelectronic component substrate. The active optoelectronic component substrate can be laterally surrounded by a spacer forming a chamber. The spacer can include an optical component mounting surface, a fluid permeable channel, and a module mounting surface. The method of manufacturing can further include the steps of applying an adhesive to the optical component mounting surface, mounting an optical component to the optical component mounting surface, curing the adhesive, mounting the optoelectronic module via the module mounting surface to an adhesive substrate, and separating the plurality of optoelectronic modules into singulated optoelectronic modules.

In another aspect, for example, a method can include the step of removing an adhesive substrate from a plurality of optoelectronic modules with thermal and/or electromagnetic radiation.

In another aspect, for example, a method can include the step of mounting an optoelectronic module or a plurality of optoelectronic modules into a host device.

In another aspect, for example, a method can include the step of subjecting an optoelectronic module or a plurality of optoelectronic modules to a heat treatment.

In another aspect, for example, a method can include the step of mounting an optoelectronic module or a plurality of optoelectronic modules via a module mounting surface to an adhesive substrate, wherein the adhesive substrate is a dicing tape.

Other aspects, features, and advantages will be apparent from the following detailed description, the accompanying drawings, and the claims.

BRIEF DESCRIPTION OF THE DRAWINGS

FIG. 1A depicts a schematic top view of an example optoelectronic module having a fluid permeable channel.

FIG. 1B depicts a schematic side view of the example optoelectronic module depicted in FIG. 1A.

FIG. 1C depicts a magnified side view of the example optoelectronic module depicted in FIG. 1A.

FIG. 1D depicts a plan view of an example optoelectronic module with adhesive.

FIG. 1E depicts a side view of the example optoelectronic module depicted in FIG. 1D.

FIG. 1F depicts a magnified side view of the example optoelectronic module depicted in FIG. 1A.

FIG. 1G depicts a side view of an example of a plurality of contiguous optoelectronic modules.

FIG. 1H depicts a side view of the plurality of optoelectronic modules depicted in FIG. 1G including singulation lines.

FIG. 2A depicts a schematic top view of another example optoelectronic module having a fluid permeable channel.

FIG. 2B depicts a schematic side view of the example optoelectronic module depicted in FIG. 2A.

FIG. 5A depicts a schematic top view of yet another example optoelectronic module having a fluid permeable channel.

FIG. 5B depicts a schematic side view of the example optoelectronic module depicted in FIG. 5A.

FIG. 5C depicts a magnified side view of the example optoelectronic module depicted in FIG. 5A.

FIG. 6A depicts a schematic top view of another example optoelectronic module having a fluid permeable channel, an adhesive channel, and an alignment component.

FIG. 6B depicts a schematic side view of the example optoelectronic module depicted in FIG. 6A.

FIG. 6C depicts a magnified side view of the example optoelectronic module depicted in FIG. 6A.

FIG. 6D depicts a magnified side view of the example optoelectronic module depicted in FIG. 6A and an example location of adhesive.

DETAILED DESCRIPTION

Figure 3C:
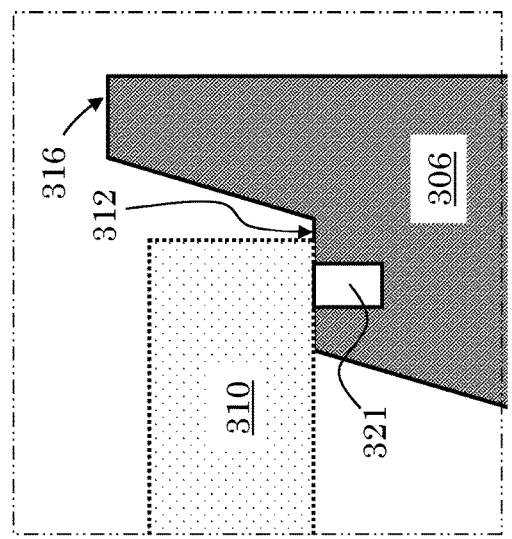
FIG. 3C depicts a magnified side view of the example optoelectronic module depicted in FIG. 3A.

FIG. 1A depicts a schematic top view of an example optoelectronic module 100 having a fluid permeable channel. The optoelectronic module 100 can include an active optoelectronic component 102 mounted electrically to an active optoelectronic component substrate 104 (e.g., a printed circuit board PCB or a metallic component such as a lead frame). The active optoelectronic component 102 can include light emitting (e.g., light-emitting diodes, laser diodes, and/or arrays of light-emitting diodes or laser diodes) and/or light detecting components (e.g., photodiodes, arrays of photodiodes, charge-couple device-based image sensors and/or complementary metal-oxide semiconductor-based image sensors).

The optoelectronic module 100 can further include a spacer 106. The spacer 106 can laterally surround the active optoelectronic component 102 thereby forming a chamber 108. In some implementations, the spacer 106 can be formed around the active optoelectronic component substrate 104. For example, a plurality of spacers 106 can be formed around a lead frame, the lead frame being a plurality of active optoelectronic component substrates 104. The spacer can be composed of a polymeric material such as an epoxy resin. The spacer 106 can be operable to substantially attenuate wavelengths of electromagnetic radiation. For example, the spacer 106 can be substantially non-transparent to wavelengths of light emitted by and/or detectable by the active optoelectronic component 102. The spacer 106 can be formed from a moldable material. For example, in some implementations the spacer 106 can be formed via injection molding and/or vacuum assisted molding in some implementations. In some implementations, the spacer 106 can be formed from a molding resin. In some implementations, the spacer 106 can further be composed of non-transparent organic and/or inorganic fillers such as carbon black.

The optoelectronic module 100 can further include an optical component 110 mounted to the spacer 106 via an optical component mounting surface 112. In some implementations, the optical component 110 can include a refractive lens, a diffractive lens, and/or an array of refractive and/or diffractive lenses. In some implementations, the optical component 110 can include a spectral filter. In some implementations, the optical component 110 can include a transparent cover. In some implementations, the optical component 110 can be mounted to the optical component mounting surface 112 at an operable distance from the active optoelectronic component 102.

The optoelectronic module 100 can further include a fluid-permeable channel 114 formed within the spacer 106. In some implementations, the fluid-permeable channel 114 is operable to permit the outflow of fluids from the chamber 108. The fluid-permeable channel 114 can be formed within the spacer 106 adjacent to the optical component 110.

The optoelectronic module 100 can further include a module mounting surface 116 formed on the spacer 106. The module mounting surface 116 is configured to permit the optoelectronic module 100 to be temporarily sealed during manufacturing of the optoelectronic module 100. In some implementations, for example, the module mounting surface 116 is characterized by a flat surface wherein the fluid-permeable channel 114 does not extend such that a seal can be established via a temporary substrate (e.g., dicing tape).

The optoelectronic module 100 can further include an optical component offset 118 as depicted in the schematic side view of FIG. 1B and the magnified side of FIG. 1C. In some implementations, the optical component offset 118 can prevent the optical component 110 from adhering to a temporary substrate, such as a dicing tape, while still allowing the optoelectronic module 100 to be securely fixed to the temporary substrate.

FIG. 1D depicts a plan view of the optoelectronic module 100 with adhesive 122. Further, FIG. 1E depicts a side view of the example optoelectronic module 100 with adhesive, and FIG. 1F depicts a magnified side view of the example optoelectronic module depicted in FIG. 1A. The adhesive 122 is depicted in an example location. In some instance, more or less adhesive, corresponding to more or less coverage may be required. The adhesive 122 can be located on the optical component mounting surface 112. In some implementations, the adhesive 122 can be located in between the optical component mounting surface 112 and the optical component 110. The adhesive 122 is operable to fix the optical component 110 to the optical component mounting surface 112. In some implementations, the adhesive 122 can be mounted to the optical component mounting surface 112 by jetting and/or screen printing. In some implementations, the adhesive 122 can be a curable adhesive such as epoxy. For, example the adhesive 122 can be mounted to the optical component mounting surface 112 in a substantially fluidic state and can be cured with electromagnetic radiation, such as ultraviolet light and/or infrared light.

FIG. 1G depicts a side view of a contiguous plurality of optoelectronic modules. The optoelectronic module 100 can be manufactured from an optoelectronic module plurality 120. The optoelectronic module plurality 120 can be mounted to an adhesive substrate 124 via the module mounting surface 116. The optoelectronic module plurality 120 can include a large number of optoelectronic modules. For example, optoelectronic module plurality 120 can include tens, hundreds, or even thousands of optoelectronic modules. The optoelectronic module plurality 120 can be a wafer. In some implementations, the adhesive substrate 124 can be an adhesive tape such as dicing tape. In some implementations, the adhesive substrate 124 can be thermally deactivated adhesive tape or can be deactivated with electromagnetic radiation, such as ultraviolet light or infrared light.

FIG. 1H depicts a side view of a contiguous plurality of optoelectronic modules with schematic singulation lines. The optoelectronic module plurality 120 can be separated into discrete optoelectronic modules (e.g., optoelectronic module 100) along singulation lines 126. In some implementations, the optoelectronic module plurality 120 can be separated by mechanical dicing. In some implementations, a fluid can be used when mechanically dicing the optoelectronic module plurality 120. In some implementations, the optoelectronic module plurality 120 can be separated by a laser beam. The module mounting surface 116 and the adhesive substrate 124 can form a barrier against the fluid. In other implementations, the module mounting surface 116 and the adhesive substrate 124 can form a barrier against particles created during the mechanical separation of optoelectronic module plurality 120 into discrete optoelectronic modules 100.

FIG. 2A depicts a schematic top view of another example optoelectronic module 200 having a fluid permeable channel. The optoelectronic module 200 can include an active optoelectronic component 202 mounted electrically to an active optoelectronic component substrate 204 (e.g., a printed circuit board PCB or a metallic component such as a lead frame). The active optoelectronic component 202 can include light emitting (e.g., light-emitting diodes, laser diodes, and/or arrays of light-emitting diodes or laser diodes) and/or light detecting components (e.g., photodiodes, arrays of photodiodes, charge-couple device-based image sensors and/or complementary metal-oxide semiconductor-based image sensors).

The optoelectronic module 200 can further include a spacer 206. The spacer 206 can laterally surround the active optoelectronic component 202 thereby forming a chamber 208. In some implementations, the spacer 206 can be formed around the active optoelectronic component substrate 204. For example, a plurality of spacers 206 can be formed around a lead frame, the lead frame being a plurality of active optoelectronic component substrates 204. The spacer can be composed of a polymeric material such as an epoxy resin. The spacer 206 can be operable to substantially attenuate wavelengths of electromagnetic radiation. For example, the spacer 206 can be substantially non-transparent to wavelengths of light emitted by and/or detectable by the active optoelectronic component 202. The spacer 206 can be formed from a moldable material. For example, in some implementations the spacer 206 can be formed via injection molding and/or vacuum assisted molding in some implementations. In some implementations, the spacer 206 can be formed from a molding resin. In some implementations, the spacer 206 can further be composed of non-transparent organic and/or inorganic fillers such as carbon black.

The optoelectronic module 200 can further include an optical component 210 mounted to the spacer 206 via an optical component mounting surface 212. In some implementations, the optical component 210 can include a refractive lens, a diffractive lens, and/or an array of refractive and/or diffractive lenses. In some implementations, the optical component 210 can include a spectral filter. In some implementations, the optical component 210 can include a transparent cover. In some implementations, the optical component 210 can be mounted to the optical component mounting surface 212 at an operable distance from the active optoelectronic component 202.

The optoelectronic module 200 can further include a fluid-permeable channel 214 formed within the spacer 206. In some implementations, the fluid-permeable channel 214 is operable to permit the outflow of fluids from the chamber 208. The fluid-permeable channel 214 can be formed within the spacer 206 adjacent to the optical component 210.

The optoelectronic module 200 further includes a module mounting surface 216 formed on the spacer 206. The module mounting surface 216 is configured to permit the optoelectronic module 200 to be temporarily sealed during manufacturing of the optoelectronic module 200. In some implementations, for example, the module mounting surface 216 is characterized by a flat surface wherein the fluid-permeable channel 214 does not extend such that a seal can be established via a temporary substrate (e.g., dicing tape).

The optoelectronic module 200 can further includes a fluid-permeable channel 214. The fluid-permeable channel 214 can extend into the module mounting surface 216 as depicted in FIG. 2A and FIG. 2B. FIG. 2B depicts a schematic side view of the optoelectronic module depicted in FIG. 2A. The fluid-permeable channel 214 extends into the module mounting surface 216. The fluid-permeable channel 214 depicted in FIG. 2A and FIG. 2B can have an advantage in some implementations. For example, adhesive used to mount the optical component 210 to the optical component mounting surface 212 can partially obstruct part of the fluid-permeable channel 214. The fluid-permeable channel 214 extension into the module mounting surface 216 (via the spacer 206) can permit outflow of fluids despite the partial incursion of adhesive into the fluid-permeable channel 214.

Figure 3D:
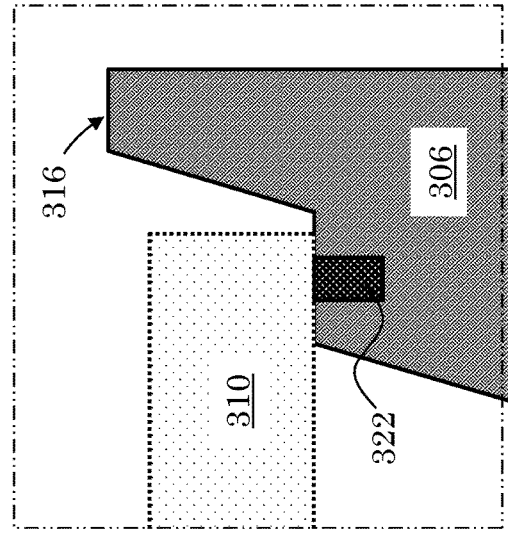
FIG. 3D depicts a magnified side view of the example optoelectronic module depicted in FIG. 3A with adhesive.
Figure 3A:
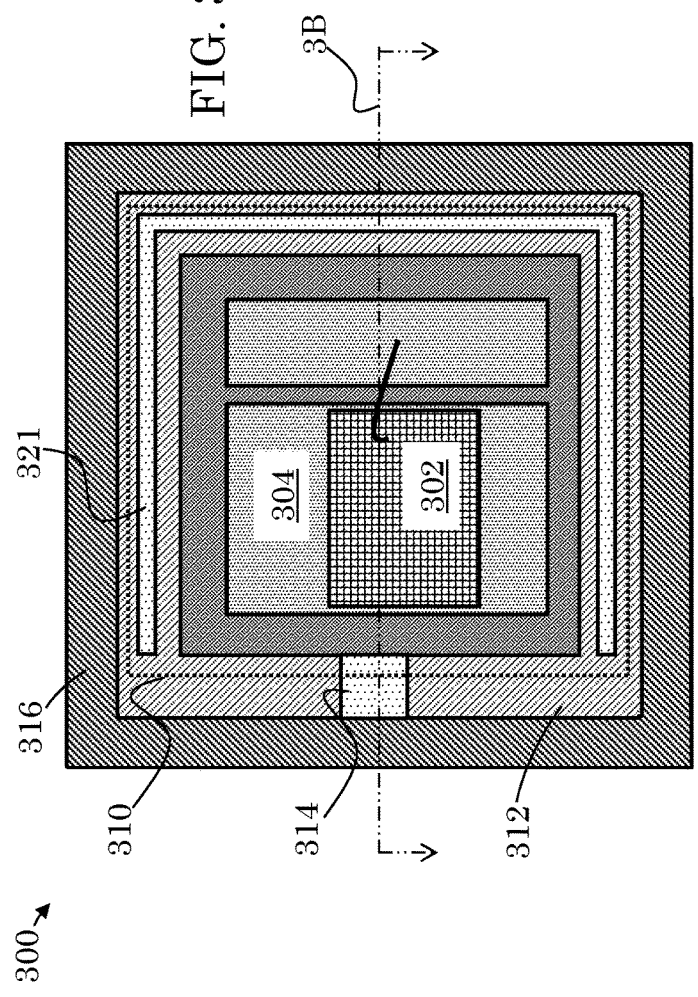
FIG. 3A depicts a schematic top view of an optoelectronic module having a fluid permeable channel and an adhesive channel.

FIG. 3A depicts a schematic top view of an example optoelectronic module 300 having a fluid permeable channel and an adhesive channel. The optoelectronic module 300 can include an active optoelectronic component 302 mounted electrically to an active optoelectronic component substrate 304 (e.g., a printed circuit board PCB or a metallic component such as a lead frame). The active optoelectronic component 302 can include light emitting (e.g., light-emitting diodes, laser diodes, and/or arrays of light-emitting diodes or laser diodes) and/or light detecting components (e.g., photodiodes, arrays of photodiodes, charge-couple device-based image sensors and/or complementary metal-oxide semiconductor-based image sensors).

The optoelectronic module 300 can further include a spacer 306. The spacer 306 can laterally surround the active optoelectronic component 302 thereby forming a chamber 308. In some implementations, the spacer 306 can be formed around the active optoelectronic component substrate 304. For example, a plurality of spacers 306 can be formed around a lead frame, the lead frame being a plurality of active optoelectronic component substrates 304. The spacer can be composed of a polymeric material such as an epoxy resin. The spacer 306 can be operable to substantially attenuate wavelengths of electromagnetic radiation. For example, the spacer 306 can be substantially non-transparent to wavelengths of light emitted by and/or detectable by the active optoelectronic component 302. The spacer 306 can be formed from a moldable material. For example, in some implementations the spacer 306 can be formed via injection molding and/or vacuum assisted molding in some implementations. In some implementations, the spacer 306 can be formed from a molding resin. In some implementations, the spacer 306 can further be composed of non-transparent organic and/or inorganic fillers such as carbon black.

The optoelectronic module 300 can further include an optical component 310 mounted to the spacer 306 via an optical component mounting surface 312. In some implementations, the optical component 310 can include a refractive lens, a diffractive lens, and/or an array of refractive and/or diffractive lenses. In some implementations, the optical component 310 can include a spectral filter. In some implementations, the optical component 310 can include a transparent cover. In some implementations, the optical component 310 can be mounted to the optical component mounting surface 312 at an operable distance from the active optoelectronic component 302.

The optoelectronic module 300 can further include a fluid-permeable channel 314 formed within the spacer 306. In some implementations, the fluid-permeable channel 314 is operable to permit the outflow of fluids from the chamber 308. The fluid-permeable channel 314 can be formed within the spacer 306 adjacent to the optical component 310.

The optoelectronic module 300 further includes a module mounting surface 316 formed on the spacer 306. The module mounting surface 316 is configured to permit the optoelectronic module 300 to be temporarily sealed during manufacturing of the optoelectronic module 300. In some implementations, for example, the module mounting surface 316 is characterized by a flat surface wherein the fluid-permeable channel 314 does not extend such that a seal can be established via a temporary substrate (e.g., dicing tape).

The optoelectronic module 300 further includes an adhesive channel 321. The adhesive channel 321 can be filled with adhesive 322 such that optical component 310 is mounted to the optical component mounting surface 312 via the adhesive 322. In some implementations, the adhesive channel 321 can lead to less tolerance in the mounting of the optical component 310 with respect to the active optoelectronic component 302.

Figure 3B:
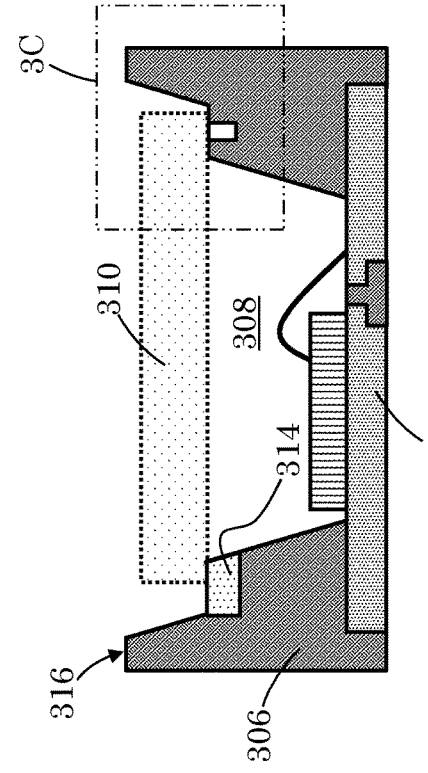
FIG. 3B depicts a schematic side view of the example optoelectronic module depicted in FIG. 3A.

FIG. 3B depicts a schematic side view of the optoelectronic module depicted in FIG. 3A. FIG. 3C depicts a magnified side view of the optoelectronic module depicted in FIG. 3A. FIG. 3D depicts a magnified side view of the optoelectronic module depicted in FIG. 3A and an example location of adhesive 322.

Figure 4C:
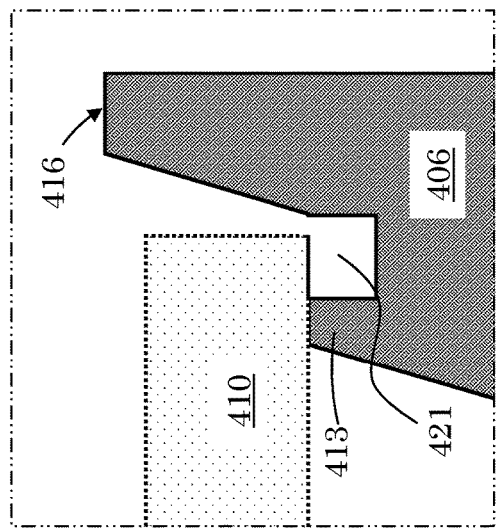
FIG. 4C depicts a magnified side view of the example optoelectronic module depicted in FIG. 4A.
Figure 4D:
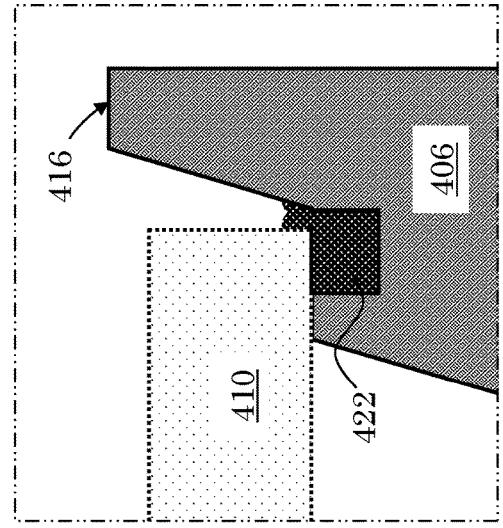
FIG. 4D depicts a magnified side view of the example optoelectronic module depicted in FIG. 4A and an example location of adhesive.
Figure 4A:
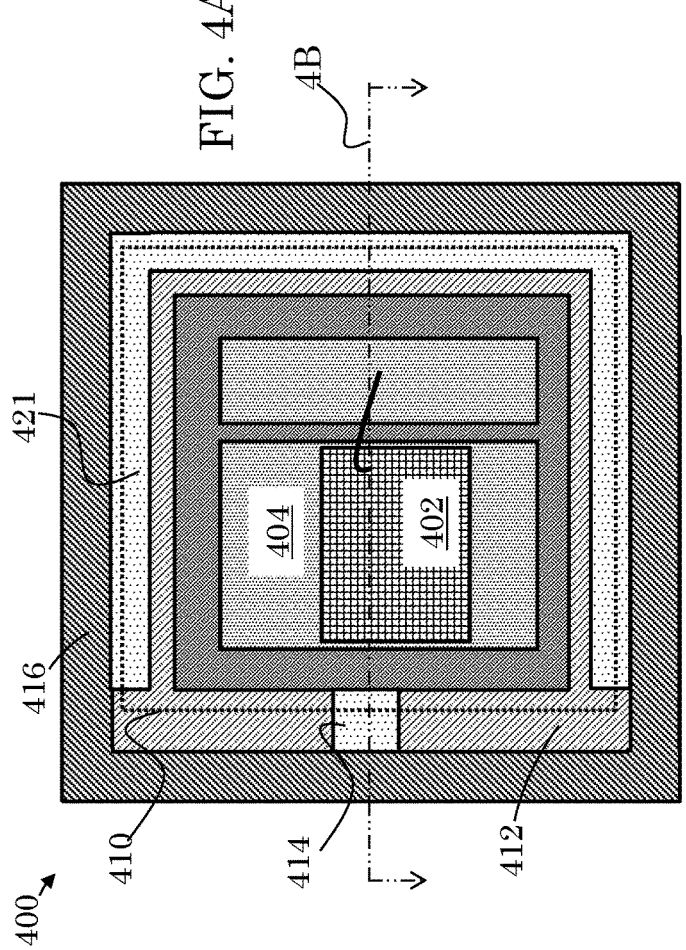
FIG. 4A depicts a schematic top view of an example optoelectronic module having a fluid permeable channel, an adhesive channel, and an alignment component.

FIG. 4A depicts a schematic top view of an example optoelectronic module 400 having a fluid permeable channel 414, an adhesive channel, and an alignment component. The optoelectronic module 400 can include an active optoelectronic component 402 mounted electrically to an active optoelectronic component substrate 404 (e.g., a printed circuit board PCB or a metallic component such as a lead frame). The active optoelectronic component 402 can include light emitting (e.g., light-emitting diodes, laser diodes, and/or arrays of light-emitting diodes or laser diodes) and/or light detecting components (e.g., photodiodes, arrays of photodiodes, charge-couple device-based image sensors and/or complementary metal-oxide semiconductor-based image sensors).

The optoelectronic module 400 can further include a spacer 406. The spacer 406 can laterally surround the active optoelectronic component 402 thereby forming a chamber 408. In some implementations, the spacer 406 can be formed around the active optoelectronic component substrate 404. For example, a plurality of spacers 406 can be formed around a lead frame, the lead frame being a plurality of active optoelectronic component substrates 404. The spacer can be composed of a polymeric material such as an epoxy resin. The spacer 406 can be operable to substantially attenuate wavelengths of electromagnetic radiation. For example, the spacer 406 can be substantially non-transparent to wavelengths of light emitted by and/or detectable by the active optoelectronic component 402. The spacer 406 can be formed from a moldable material. For example, in some implementations the spacer 406 can be formed via injection molding and/or vacuum assisted molding in some implementations. In some implementations, the spacer 406 can be formed from a molding resin. In some implementations, the spacer 406 can further be composed of non-transparent organic and/or inorganic fillers such as carbon black.

The optoelectronic module 400 can further include an optical component 410 mounted to the spacer 406 via an optical component mounting surface 412. In some implementations, the optical component 410 can include a refractive lens, a diffractive lens, and/or an array of refractive and/or diffractive lenses. In some implementations, the optical component 410 can include a spectral filter. In some implementations, the optical component 410 can include a transparent cover. In some implementations, the optical component 410 can be mounted to the optical component mounting surface 412 at an operable distance from the active optoelectronic component 402.

Figure 4B:
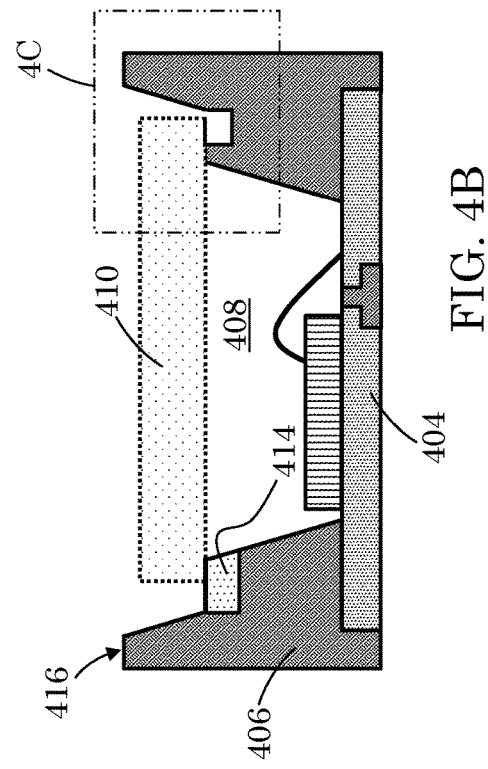
FIG. 4B depicts a schematic side view of the example optoelectronic module depicted in FIG. 4A.

The optoelectronic module 400 can further include an alignment component 413 and an adhesive channel 421. The alignment component 413 can be an extension of the spacer 406, the alignment component 413 terminating in the optical component mounting surface 412. The adhesive channel 421 can be filled with adhesive 422 such that optical component 410 is mounted to the optical component mounting surface 412 via the adhesive 422. In some implementations, the adhesive channel 421 can lead to less tolerance in the mounting of the optical component 410 with respect to the active optoelectronic component 402. In some implementations, the alignment component 413 and the adhesive channel 421 can lead to less tolerance in the mounting of the optical component 410 with respect to the active optoelectronic component 402. For example, in some cases the alignment component 413 can be adjusted (e.g., via mechanically machining, or via laser) so that the optical component 410 can be mounted with respect to the active optoelectronic component 402. Accordingly, in some cases the alignment component 413 can be configured to correct for tilt. In some implementations, the optical component 410 is directly mounted to the optical component mounting surface 412 via the alignment component 413. The optoelectronic module 400 further includes a module mounting surface 416 on the spacer 406. FIG. 4B depicts a schematic side view of the optoelectronic module depicted in FIG. 4A. FIG. 4C depicts a magnified side view of the optoelectronic module depicted in FIG. 4A. FIG. 4D depicts a magnified side view of the optoelectronic module depicted in FIG. 4A and an example location of adhesive.

FIG. 5A depicts a schematic top view of another optoelectronic module 500 having a fluid permeable channel. The optoelectronic module 500 can include an active optoelectronic component 502 mounted electrically to an active optoelectronic component substrate 504 (e.g., a printed circuit board PCB or a metallic component such as a lead frame). The active optoelectronic component 502 can include light emitting (e.g., light-emitting diodes, laser diodes, and/or arrays of light-emitting diodes or laser diodes) and/or light detecting components (e.g., photodiodes, arrays of photodiodes, charge-couple device-based image sensors and/or complementary metal-oxide semiconductor-based image sensors).

The optoelectronic module 500 can further include a spacer 506. The spacer 506 can laterally surround the active optoelectronic component 502 thereby forming a chamber 508. In some implementations, the spacer 506 can be formed around the active optoelectronic component substrate 504. For example, a plurality of spacers 506 can be formed around a lead frame, the lead frame being a plurality of active optoelectronic component substrates 504. The spacer can be composed of a polymeric material such as an epoxy resin. The spacer 506 can be operable to substantially attenuate wavelengths of electromagnetic radiation. For example, the spacer 506 can be substantially non-transparent to wavelengths of light emitted by and/or detectable by the active optoelectronic component 502. The spacer 506 can be formed from a moldable material. For example, in some implementations the spacer 506 can be formed via injection molding and/or vacuum assisted molding in some implementations. In some implementations, the spacer 506 can be formed from a molding resin. In some implementations, the spacer 506 can further be composed of non-transparent organic and/or inorganic fillers such as carbon black.

The optoelectronic module 500 can further include an optical component 510 mounted to the spacer 506 via an optical component mounting surface 512. In some implementations, the optical component 510 can include a refractive lens, a diffractive lens, and/or an array of refractive and/or diffractive lenses. In some implementations, the optical component 510 can include a spectral filter. In some implementations, the optical component 510 can include a transparent cover. In some implementations, the optical component 510 can be mounted to the optical component mounting surface 512 at an operable distance from the active optoelectronic component 502. The optoelectronic module 500 can further include a fluid-permeable channel 514 formed within the spacer 506. The fluid-permeable channel 514 includes a fluid-permeable membrane 528 (e.g., GORE-TEX®). The fluid-permeable membrane 528 can be fixed on or in the fluid-permeable channel 514. In some implementations, the fluid-permeable channel 514 is operable to permit the outflow of fluids from the chamber 508. The fluid-permeable channel 514 can be formed within the active optoelectronic component substrates 504 adjacent to the active optoelectronic component 502. In some implementations, the optoelectronic module 500 can further include a module mounting surface 516 formed on the spacer 506. The module mounting surface 516 is configured to permit the optoelectronic module 500 to be temporarily sealed during manufacturing of the optoelectronic module 500. In some implementations, for example, the module mounting surface 516 is characterized by a flat surface such that a seal can be established via a temporary substrate (e.g., dicing tape). In some implementations, for example, the optoelectronic module 500 need not include a module mounting surface 516, the module can be mounted via the optical component mounting surface 512.

FIG. 5B depicts a schematic side view of the optoelectronic module depicted in FIG. 5A. and FIG. 5C depicts a magnified side view of the optoelectronic module depicted in FIG. 5A.

FIG. 6A depicts a schematic top view of an optoelectronic module 600 having a fluid permeable channel and an adhesive channel. The optoelectronic module 600 can include an active optoelectronic component 602 mounted electrically to an active optoelectronic component substrate 604 (e.g., a printed circuit board PCB or a metallic component such as a lead frame). The active optoelectronic component 602 can include light emitting (e.g., light-emitting diodes, laser diodes, and/or arrays of light-emitting diodes or laser diodes) and/or light detecting components (e.g., photodiodes, arrays of photodiodes, charge-couple device-based image sensors and/or complementary metal-oxide semiconductor-based image sensors).

The optoelectronic module 600 can further include a spacer 606. The spacer 606 can laterally surround the active optoelectronic component 602 thereby forming a chamber 608. In some implementations, the spacer 606 can be formed around the active optoelectronic component substrate 604. For example, a plurality of spacers 606 can be formed around a lead frame, the lead frame being a plurality of active optoelectronic component substrates 604. The spacer can be composed of a polymeric material such as an epoxy resin. The spacer 606 can be operable to substantially attenuate wavelengths of electromagnetic radiation. For example, the spacer 606 can be substantially non-transparent to wavelengths of light emitted by and/or detectable by the active optoelectronic component 602. The spacer 606 can be formed from a moldable material. For example, in some implementations the spacer 606 can be formed via injection molding and/or vacuum assisted molding in some implementations. In some implementations, the spacer 606 can be formed from a molding resin. In some implementations, the spacer 606 can further be composed of non-transparent organic and/or inorganic fillers such as carbon black.

The optoelectronic module 600 can further include an optical component 610 mounted to the spacer 606 via an optical component mounting surface 612. In some implementations, the optical component 610 can include a refractive lens, a diffractive lens, and/or an array of refractive and/or diffractive lenses. In some implementations, the optical component 610 can include a spectral filter. In some implementations, the optical component 610 can include a transparent cover. In some implementations, the optical component 610 can be mounted to the optical component mounting surface 612 at an operable distance from the active optoelectronic component 602.

The optoelectronic module 600 can further include a fluid-permeable channel 614 formed within the spacer 606. In some implementations, the fluid-permeable channel 614 is operable to permit the outflow of fluids from the chamber 608. The fluid-permeable channel 614 can be formed within the spacer 606 adjacent to the optical component 610. The optoelectronic module 600 further includes a module mounting surface 616 formed on the spacer 606. The module mounting surface 616 is configured to permit the optoelectronic module 600 to be temporarily sealed during manufacturing of the optoelectronic module 600. In some implementations, for example, the module mounting surface 616 is characterized by a flat surface wherein the fluid-permeable channel 614 does not extend such that a seal can be established via a temporary substrate (e.g., dicing tape). The optoelectronic module 600 further includes an adhesive channel 621 and an alignment component 613 formed within the optical component 610. In some implementations, the alignment component 613 and the adhesive channel 621 can lead to less tolerance in the mounting of the optical component 610 with respect to the active optoelectronic component 602. For example, in some cases the alignment component 613 can be adjusted (e.g., via mechanically machining, or via laser) so that the optical component 610 can be mounted with respect to the active optoelectronic component 602.

FIG. 6B depicts a schematic side view of the optoelectronic module depicted in FIG. 6A, FIG. 6C depicts a magnified side view of the optoelectronic module depicted in FIG. 6A, and FIG. 6D depicts a magnified side view of the optoelectronic module depicted in FIG. 6A and an example location of adhesive.

Figure 7:
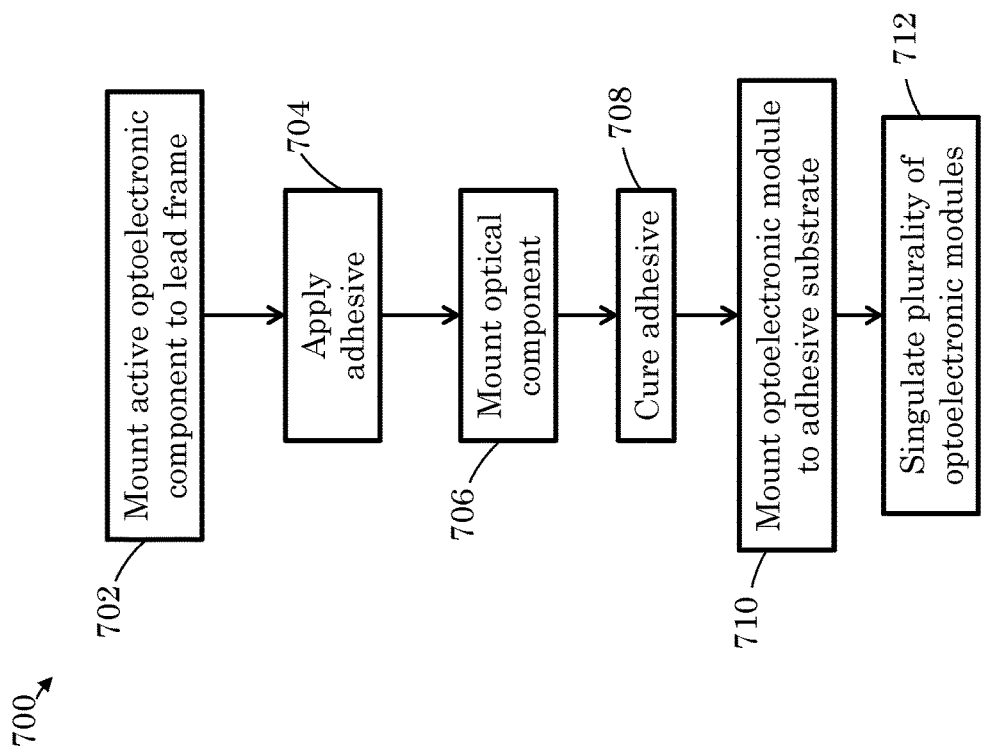
FIG. 7 depicts a process of manufacturing an example optoelectronic module from a plurality of optoelectronic modules.

FIG. 7 depicts a process 700 of manufacturing an optoelectronic module from a plurality of optoelectronic modules. The process 700 of manufacturing an optoelectronic module from a plurality of optoelectronic modules includes an electrically mounting step 702 wherein a plurality of active optoelectronic components is mounted electrically to a plurality of active optoelectronic component substrates. The active optoelectronic component substrates can be laterally surrounded by a plurality of spacers. The spacers can form a plurality of respective chambers, and can further include a plurality of respective optical component mounting surfaces. The spacer can further include a plurality of respective fluid permeable channels, and a plurality of respective module mounting surfaces.

The process 700 of manufacturing an optoelectronic module from a plurality of optoelectronic modules can further include an adhesive application step 704 wherein an adhesive is applied to the plurality of optical component mounting surfaces.

The process 700 of manufacturing an optoelectronic module from a plurality of optoelectronic modules can further include an optical component mounting step 706 wherein a plurality of optical components is mounted to a plurality of respective optical component mounting surfaces.

The process 700 of manufacturing an optoelectronic module from a plurality of optoelectronic modules can further include an adhesive curing step 708 wherein adhesive is cured (e.g., via the application of heat and/or electromagnetic radiation such as ultraviolet light).

The process 700 of manufacturing an optoelectronic module from a plurality of optoelectronic modules can further include an optoelectronic module mounting step 710 wherein a plurality of optoelectronic modules is mounted to an adhesive substrate (e.g., a dicing tape) via a plurality of module mounting surfaces.

The process 700 of manufacturing an optoelectronic module from a plurality of optoelectronic modules can further include a module separation step 712 wherein the plurality of optoelectronic modules is separated into discrete optoelectronic modules (e.g., via dicing).

Figure 8:
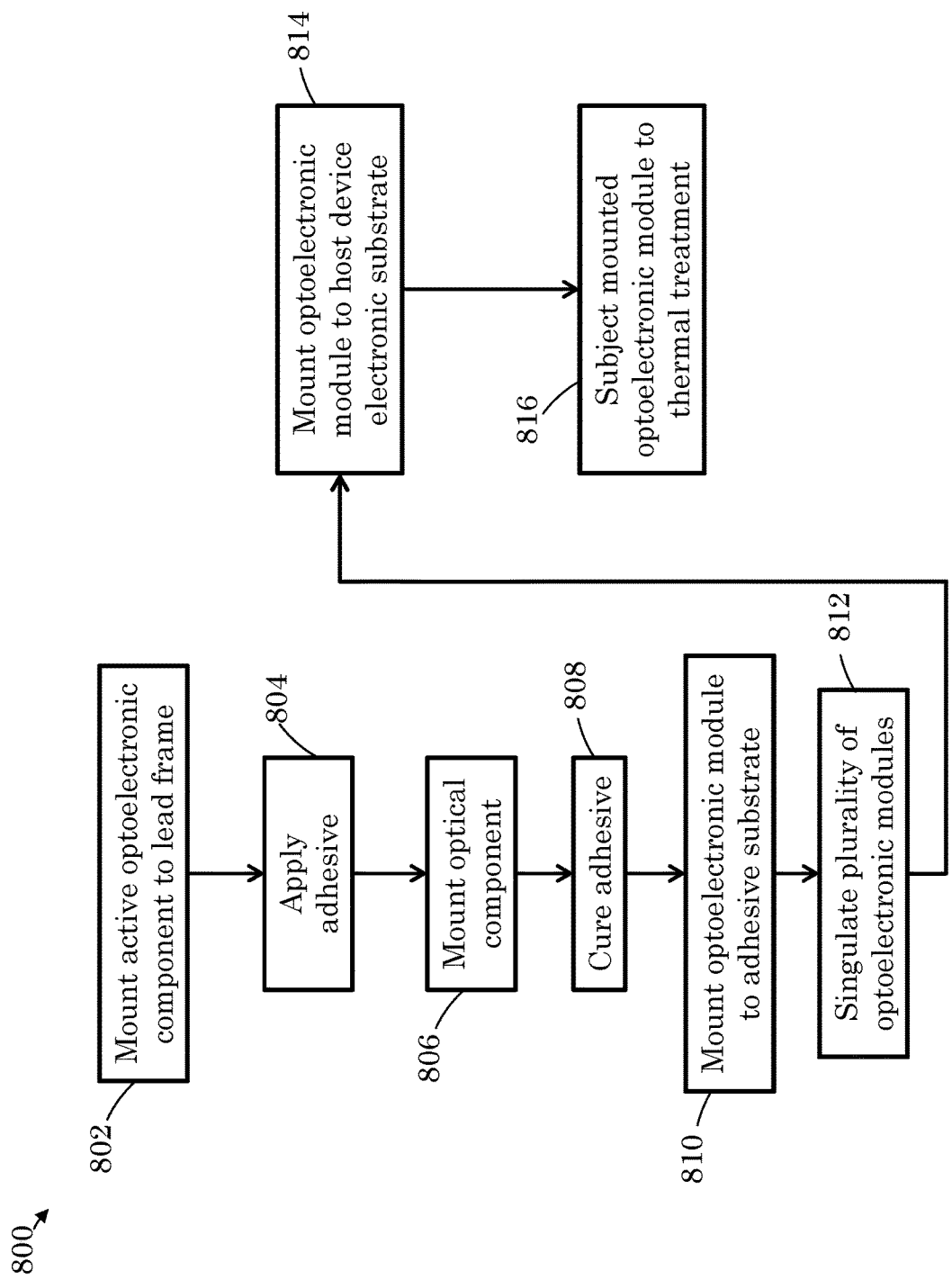
FIG. 8 depicts another process of manufacturing an example optoelectronic module from a plurality of optoelectronic modules.

FIG. 8 depicts a process 800 of manufacturing an optoelectronic module from a plurality of optoelectronic modules. The process 800 of manufacturing an optoelectronic module from a plurality of optoelectronic modules 800 includes an electrically mounting step 802 wherein a plurality of active optoelectronic components is mounted electrically to a plurality of active optoelectronic component substrates. The active optoelectronic component substrates can be laterally surrounded by a plurality of spacers. The spacers can form a plurality of respective chambers, and can further include a plurality of respective optical component mounting surfaces. The spacer can further include a plurality of respective fluid permeable channels, and a plurality of respective module mounting surfaces.

The process 800 of manufacturing an optoelectronic module from a plurality of optoelectronic modules can further include an adhesive application step 804 wherein an adhesive is applied to the plurality of optical component mounting surfaces, and an optical component mounting step 806 wherein a plurality of optical components is mounted to a plurality of respective optical component mounting surfaces.

The process 800 of manufacturing an optoelectronic module from a plurality of optoelectronic modules can further include an adhesive curing step 808 wherein adhesive is cured (e.g., via the application of heat and/or electromagnetic radiation such as ultraviolet light).

The process 800 of manufacturing an optoelectronic module from a plurality of optoelectronic modules can further include an optoelectronic module mounting step 810 wherein a plurality of optoelectronic modules is mounted to an adhesive substrate (e.g., a dicing tape) via a plurality of module mounting surfaces.

The process 800 of manufacturing an optoelectronic module from a plurality of optoelectronic modules can further include a module separation step 812 wherein the plurality of optoelectronic modules is separated into discrete optoelectronic modules (e.g., via dicing).

The process 800 of manufacturing an optoelectronic module from a plurality of optoelectronic modules can further include a host device mounting step 814 wherein a discrete optoelectronic module is mounted onto a circuit board (e.g., to be mounted into a host device), a heat treatment step 816 wherein the optoelectronic module is subject to a heat treatment followed by cooling in order to electrically connect the optoelectronic module to the circuit board (e.g., via the melting and cooling of solder and solder flux).

Other modifications may be made to the foregoing implementations, and features described above in different implementations may be combined in the same implementation. Thus, other implementations are within the scope of the claims.

What is claimed is:

1. A method of manufacturing an optoelectronic module from a plurality of optoelectronic modules, the method comprising the steps of:
    electrically mounting a plurality of active optoelectronic components to an active optoelectronic component substrate, the active optoelectronic component substrate being laterally surrounded by a spacer forming a chamber, the spacer including
        an optical component mounting surface,
        a fluid permeable channel formed within the spacer which comprises a fluid-permeable membrane and is operable to permit the outflow of fluids from the chamber, and
        module mounting surface, and wherein an adhesive channel partially surrounds the chamber from a top view facing the optical component mounting surface, wherein the fluid-permeable channel extends into the module mounting surface;
    applying an adhesive to the optical component mounting surface comprising filling the adhesive channel with the adhesive;
    mounting an optical component to the optical component mounting surface;
    curing the adhesive;
    mounting the optoelectronic module via the module mounting surface to an adhesive substrate; and
    separating the plurality of optoelectronic modules into singulated optoelectronic modules.

2. The method of claim 1 further comprising the step of removing the adhesive substrate from the plurality of optoelectronic modules with thermal and/or electromagnetic radiation.

3. The method of claim 2 further comprising the step of mounting the optoelectronic module into a host device.

4. The method of claim 3 further comprising the step of subjecting the optoelectronic module to a heat treatment.

5. The method of claim 1 wherein the adhesive substrate is a dicing tape.

6. The method of claim 1, wherein the spacer comprises the adhesive channel, wherein the adhesive channel is adjacent to and recessed with respect to the optical component mounting surface.

7. The method of claim 6, wherein the spacer further comprises an alignment component, wherein the alignment component is located laterally between the adhesive channel and the chamber from the top view facing the optical component mounting surface.

8. The method of claim 1, wherein the optical component comprises the adhesive channel, wherein the adhesive channel is recessed with respect to a bottom surface of the optical component facing the optical component mounting surface.

9. The method of claim 8, wherein the optical component further comprises an alignment component, wherein the alignment component is located laterally between the adhesive channel and the chamber from the top view facing the optical component mounting surface.

* * * * *